US009967511B2

(12) United States Patent
Ritter et al.

(10) Patent No.: US 9,967,511 B2
(45) Date of Patent: May 8, 2018

(54) THROUGH PCB HOLE CABLE LEAD DRESS CONDUIT

(71) Applicant: THOMSON LICENSING, Issy-les-Moulineaux (FR)

(72) Inventors: Darin Bradley Ritter, Indianapolis, IN (US); Mickey Jay Hunt, Camby, IN (US)

(73) Assignee: THOMSON Licensing, Issy-les-Moulineaux (FR)

( * ) Notice: Subject to any disclaimer, the term of this patent is extended or adjusted under 35 U.S.C. 154(b) by 0 days. days.

(21) Appl. No.: 15/031,347

(22) PCT Filed: Sep. 18, 2014

(86) PCT No.: PCT/US2014/056359
§ 371 (c)(1),
(2) Date: Apr. 22, 2016

(87) PCT Pub. No.: WO2015/073116
PCT Pub. Date: May 21, 2015

(65) Prior Publication Data
US 2016/0255300 A1    Sep. 1, 2016

Related U.S. Application Data

(60) Provisional application No. 61/903,251, filed on Nov. 12, 2013.

(51) Int. Cl.
*H05K 7/02* (2006.01)
*H05K 7/04* (2006.01)
(Continued)

(52) U.S. Cl.
CPC ............... *H04N 5/64* (2013.01); *G06F 1/16* (2013.01); *G06F 1/181* (2013.01); *H05K 5/0026* (2013.01); *H05K 5/0213* (2013.01)

(58) Field of Classification Search
CPC .. H04N 5/64; G06F 1/16; G06F 1/181; H05K 5/0026; H05K 5/0213
(Continued)

(56) References Cited

U.S. PATENT DOCUMENTS 3,488,628 A * 1/1970 Lundergan ........... H01R 4/4818
361/767
3,622,943 A   11/1971 Reimer
(Continued)

FOREIGN PATENT DOCUMENTS

CN   201936400   8/2011
EP   0079805     5/1983
(Continued)

OTHER PUBLICATIONS

Extended European Search Report dated May 9, 2017.

*Primary Examiner* — Hung S Bui
(74) *Attorney, Agent, or Firm* — Richard Laperuta; Jerome G. Schaefer

(57) ABSTRACT

Devices and methods for routing cables through a printed circuit board (PCB) include an enclosure having at least one cable guide and a cable duct. A PCB is mounted in the enclosure, such that the cable duct penetrates the PCB through a hole in the PCB. At least one additional component is mounted in the enclosure and connected to at least one cable that is attached to the at least one cable guide and the cable duct. The at least one cable enters the duct on a first side of the PCB and exits the duct on a second side of the PCB.

18 Claims, 12 Drawing Sheets

(51) Int. Cl.
*H04N 5/64* (2006.01)
*G06F 1/16* (2006.01)
*G06F 1/18* (2006.01)
*H05K 5/00* (2006.01)
*H05K 5/02* (2006.01)

(58) Field of Classification Search
USPC .................. 361/748, 760, 807, 809, 810
See application file for complete search history.

(56) References Cited

U.S. PATENT DOCUMENTS

| | | | |
|---|---|---|---|
| 4,454,552 A | 6/1984 | Barnes et al. | |
| 5,596,178 A * | 1/1997 | Christian | H05K 3/225 174/262 |
| 5,828,341 A * | 10/1998 | Delamater | G06F 1/1616 343/702 |
| 6,567,602 B2 | 5/2003 | Cole et al. | |
| 6,621,710 B1 * | 9/2003 | Cheng | H01R 13/22 324/756.03 |
| 7,148,428 B2 * | 12/2006 | Meier | G06F 1/184 174/260 |
| 7,564,412 B2 * | 7/2009 | Walker | G06F 1/1616 343/702 |
| 7,725,095 B2 | 5/2010 | Tey et al. | |
| 8,393,757 B2 * | 3/2013 | Uemoto | F21V 14/02 165/185 |
| 8,563,876 B1 | 10/2013 | Gretz | |
| 8,674,217 B2 * | 3/2014 | Huang | G06F 1/183 174/40 CC |
| 8,952,274 B2 * | 2/2015 | Lalancette | H02G 3/04 138/110 |
| 2003/0028902 A1 | 2/2003 | Cubley et al. | |
| 2006/0067066 A1 | 3/2006 | Meier et al. | |
| 2010/0039579 A1 * | 2/2010 | Park | G02F 1/133603 349/58 |
| 2010/0125878 A1 | 5/2010 | Jing et al. | |
| 2010/0156262 A1 * | 6/2010 | Reingruber | F21V 3/00 313/46 |
| 2011/0237304 A1 | 9/2011 | Morita | |
| 2011/0310624 A1 * | 12/2011 | Preuschl | F21V 23/002 362/373 |
| 2012/0201041 A1 * | 8/2012 | Gergets | B60Q 1/2611 362/493 |

FOREIGN PATENT DOCUMENTS

| | | |
|---|---|---|
| JP | 2005093226 | 4/2005 |
| JP | 2008243955 | 10/2008 |

* cited by examiner

THROUGH PCB HOLE CABLE LEAD DRESS CONDUIT

CROSS-REFERENCE TO RELATED APPLICATIONS

This application claims the benefit, under 35 U.S.C. § 365 of International Application PCT/US2014/056359 filed Sep. 18, 2014, which was published in accordance with PCT Article 21(2) on May 21, 2015 in English and which claims the benefit of U.S. provisional patent application No. 61/903,251 filed Nov. 12, 2013. The provisional and PCT applications are expressly incorporated by reference herein in their entirety for all purposes.

TECHNICAL FIELD

The present invention generally relates to electronic devices and, more particularly, to electronic devices with cable routing through a printed circuit board.

BACKGROUND

Consumer and market preference for set top boxes, such as computers, game consoles, DVD players, CD player, etc., is to have such devices be compact. However, it is difficult to keep devices small, because set top boxes are required to perform more functions, which implies that they are contain more internal components.

Wireless antennas are a key component of many set top boxes. Wireless antennas for set top boxes are often rectangular in shape and are oriented inside the box to give the best performance (e.g., signal transmission/reception) possible. This means that there should be adequate clearance from metal parts in the box and that placement and orientation of the antennas should be as at diverse as possible within the box. Further, to minimize the risk of electrostatic discharge associated with antennas, some set top boxes are enlarged to accommodate a vertical orientation of the wireless antennas. Alternatively, when a larger set top box would not be accepted by the consumer, antennas may be positioned horizontally, yielding reduced antenna performance. There is therefore a trade-off from having a smaller size box with a horizontally oriented antenna in that one accepts a box that does not have an antenna that operates optimally. Thus, with the consumer preference for electronic devices, such as set top boxes, to be as small and slim as possible, horizontal form factors are often needed.

Additionally, the need for slim devices to include many functions and many interior components also means that the cables within the devices need to be efficiently routed within the devices in manner that does not necessitate a larger device with a larger volume. The cables cannot interfere with other components.

SUMMARY

An embodiment of the present principles includes a device enclosure that has at least one cable guide and a cable duct. A printed circuit board (PCB) is mounted in the enclosure, such that the cable duct penetrates the PCB through a hole in the PCB. At least one additional component is mounted in the enclosure and is connected to at least one cable that is attached to the at least one cable guide and the cable duct. The at least one cable enters the duct on a first side of the PCB and exits the duct on a second side of the PCB.

An embodiment of the present principles includes a device enclosure that has at least one cable guide and a cable duct, where the duct has one or more notches that provide access to a duct interior space. A PCB is mounted in the enclosure, such that the cable duct penetrates the PCB through a hole in the PCB. An antenna is mounted in the enclosure and is connected to at least one cable that is attached to the at least one cable guide and runs into the duct interior space. The least one cable enters the duct on a first side of the PCB and exits the duct on a second side of the PCB and is held in the one or more notches by friction.

A method for assembling a device includes providing an enclosure having one or more cable guides and a cable duct that has notches. A cable is attached to said one or more cable guides and is run into the cable duct, such that a cable lead is within a duct interior space. A PCB is installed in the enclosure, such that the cable duct aligns with a hole in the PCB. The cable lead passes through the duct interior space and out the hole in the PCB.

BRIEF DESCRIPTION OF THE DRAWINGS

The teachings of the present invention can be readily understood by considering the following detailed description in conjunction with the accompanying drawings, in which.

Figure 1:
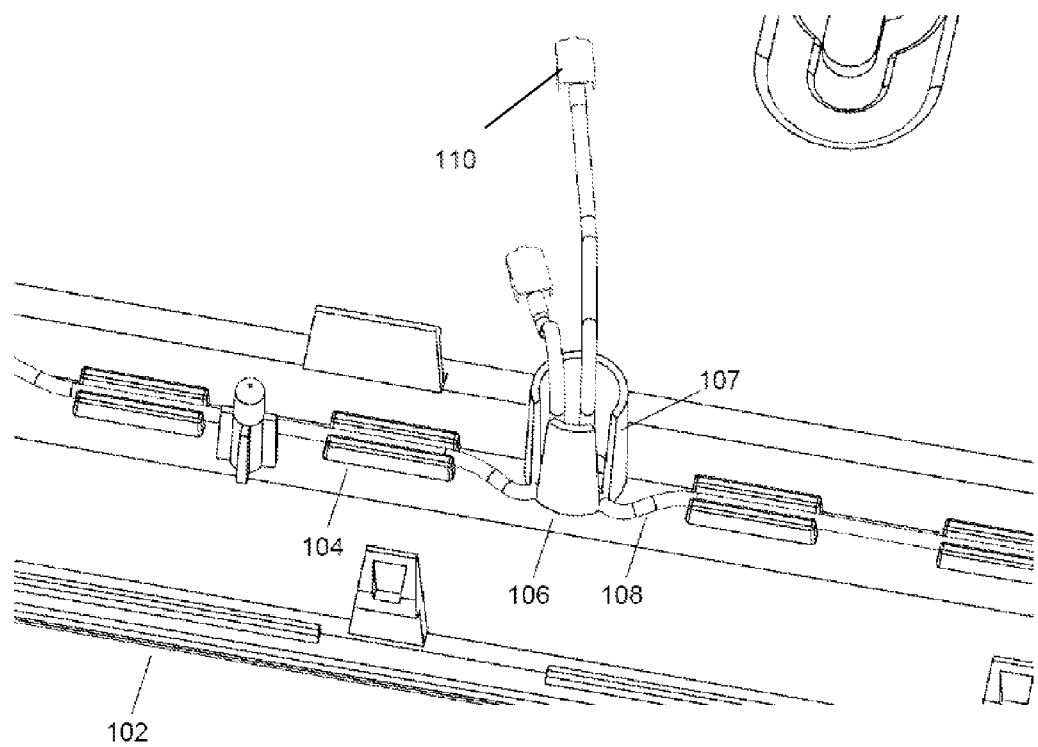
FIG. 1 is a diagram of cable guides and a cable duct in an enclosure in accordance with the present principles.

It should be understood that the drawings are for purposes of illustrating the concepts of the invention and are not necessarily the only possible configurations for illustrating the invention. To facilitate understanding, identical reference numerals have been used, where possible, to designate identical elements that are common to the figures.

DETAILED DESCRIPTION OF PREFERRED EMBODIMENTS

Embodiments of the present principles provide structures that aid in the design and assembly of compact set-top boxes. To solve the problem of cable routing around components with very little clearance, a hole in a printed circuit board (PCB) component is provided. However, this design can be difficult to assemble, as a worker needs to manually feed cables through the hole. Long cables and/or longer cable leads make this task easier at the expense of increasing the amount of excess cable, which both takes up space inside the box and increases the cost of the device.

The present embodiments therefore provide a duct on the set-top box's enclosure that holds cables and guides them through the hole in the PCB. This allows a worker to feed the cables through the PCB with little difficulty and furthermore provides a guide for the placement of the PCB in the enclosure.

Referring now in specific detail to the drawings in which like reference numerals identify similar or identical elements throughout the several views, and initially to FIG. 1, a diagram of an exemplary enclosure 102 is shown. The enclosure 102 includes cable guides 104 that provide a secure path for cables 108 along the side of the enclosure 102. The cable guides 104 may be sized to provide friction when a cable 108 is inserted, thereby preventing the cables 108 from coming loose during handling. An aperture of the cable guides 104 can be wedge-shaped, can have a width that is uniformly slightly narrower than the thickness of the cables 108, or can have a narrow opening that widens into a holding portion. It is also contemplated that other forms of securing the cables 108 to the cable guides 104 can be used, such as glue or hook-and-loop fasteners. The cable guides 102 can be formed on the base interior surface of the enclosure.

The cables 108 lead to a cable duct or conduit 106 having notches 107. The cables are inserted into the cable duct 106 through the notches 107 in the side of the duct 106 and are held in place by friction or any other appropriate securing mechanism. The notches 107 may taper or may have a uniform width selected to correspond to the width of the cables 108. Free ends of the cables 108 form the cable leads, which are retained inside the body of the duct 106 and extend from the top opening of the duct 106. The cable duct 106 collects the cable leads 110 so that they are easily fed through a hole in a PCB during assembly. The leads 110 can be considered the end portion of the cable having a connector head or can be just the connector head. The cable duct 106 may be formed as a part of the enclosure 102 or may be a separate piece that is attached after formation of the enclosure by, e.g., glue or mechanical engagement. The cable duct 106 can be formed on the base interior surface of the enclosure and from the same surface as the cable guides 104.

Figure 2:
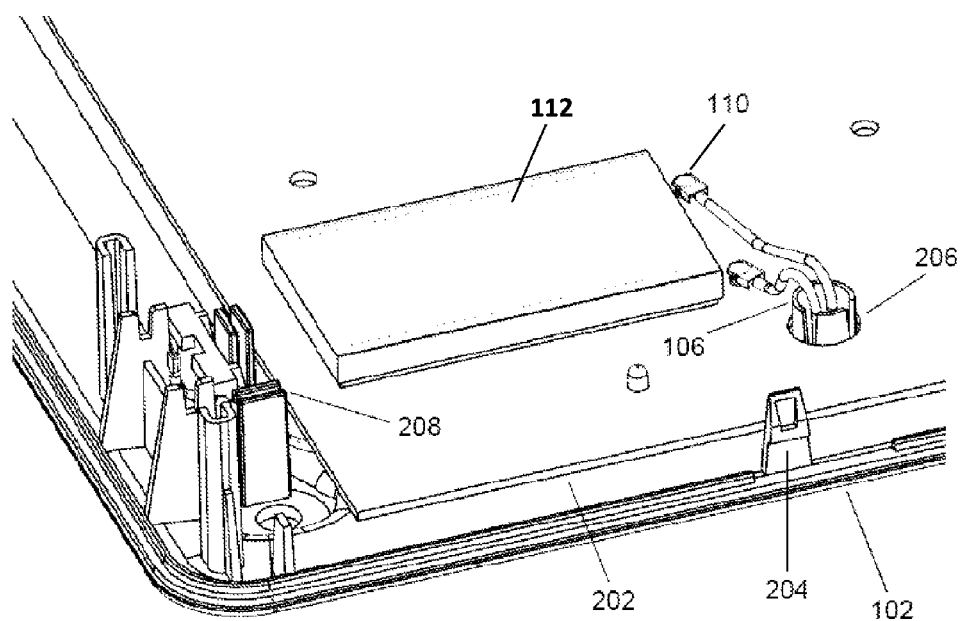
FIG. 2 is a diagram of an enclosure with a cable duct and an installed printed circuit board (PCB) in accordance with the present principles.

Referring now to FIG. 2, the enclosure 102 is shown with a PCB 202 installed. The PCB engages with clips 204 on the enclosure 102 and a hole 206 in the PCB aligns with the cable duct 106. The cable leads 110 emerge through the duct 106 and are connected to appropriate contacts on the PCB 202. Also shown is an antenna assembly 208 that may include an antenna, PCB and appropriate attachment structures to hold the antenna to the enclosure 102. The cable guides 104 provide a secure passage for the cables 108 to components such as the antenna assembly 208 or some other electronic component assembly which would require the same type of cabling requirements as the antenna. As such, it should be recognized that the cable guides 104 may lead to any appropriate component on the enclosure 102 or PCB, such as smart card readers, power supplies, etc., and that there may be multiple cable ducts 106 through one or more PCBs.

The cable ducts 106 additionally allow for the length of the cable leads 110 to be the precise length needed to make a connection a second component 112 on or over the PCB 202. Without ducts 106 to guide the leads 110 through the hole 206, additional length would be needed to allow the person assembling the device to manually thread the leads 110 through the hole 206. Longer cable leads 110 may be folded or coiled within the duct 106 so that the PCB 202 may be installed without interference. After positioning the PCB 202, the cable leads 110 can be pulled out and connected. Thus the present embodiments save on both assembly time as well as material costs as shorter cables 108 may be used.

Figure 3:
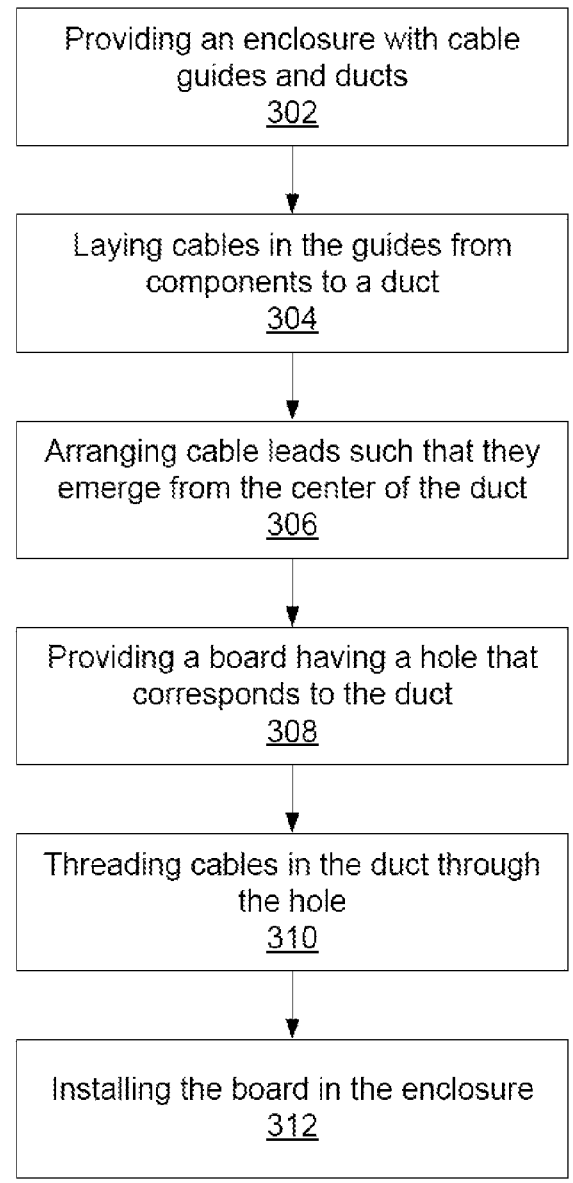
FIG. 3 is a block/flow diagram of a method for assembling an enclosure having cable guides and a cable duct in accordance with the present principles.

Referring now to FIG. 3, a method of assembling a device is shown. Block 302 provides an enclosure 102 as described above, having cable guides 104 and a cable duct 106. In block 304, the cables are laid into the guides 104 from device components such as the antenna assembly 208 to the cable duct 106, where they are inserted into the cable duct 106 by, e.g., notches 107. In block 306, the cable leads are arranged within the cable duct 106 by, e.g., coiling or folding them within the duct 106 or causing them to emerge from the center of the duct 106.

Block 308 provides a board, e.g., a PCB 202, that has a hole 206 that corresponds to the position of the cable duct 106. In block 310, the cable leads 110 are threaded through the hole 206 and, in block 312, the board 202 is installed.

Figure 4:
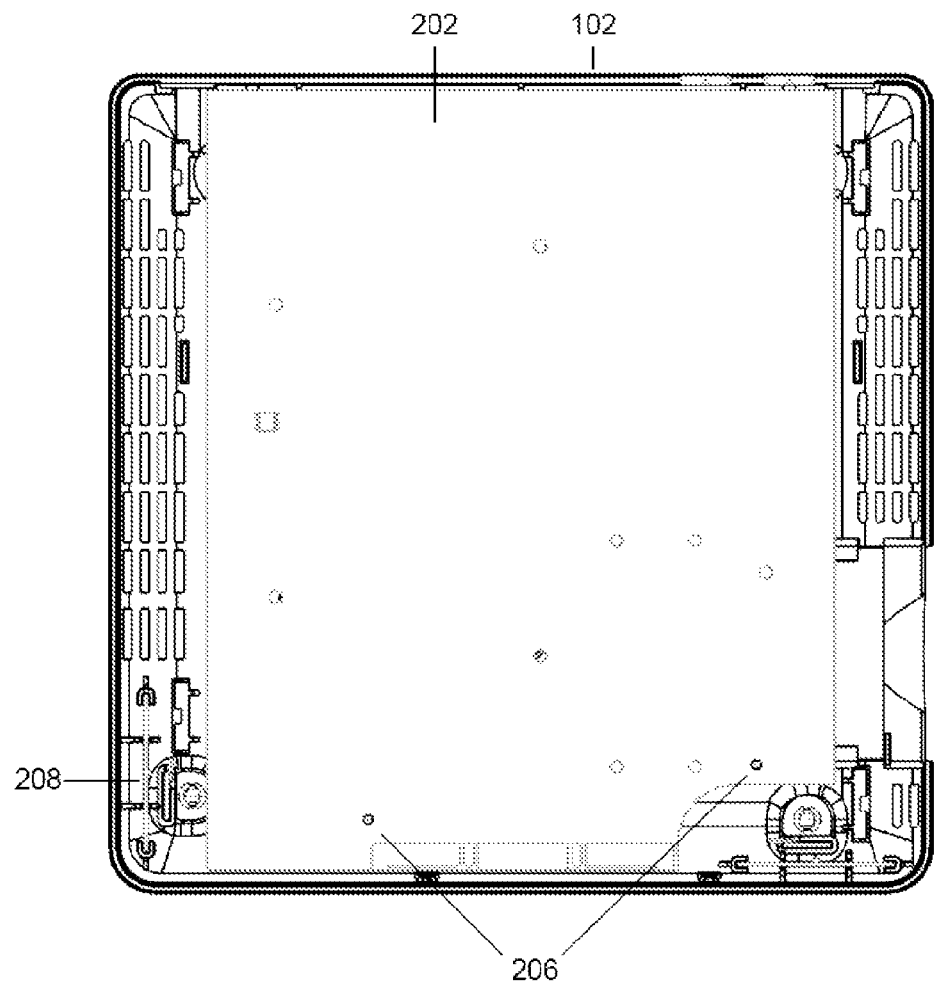
FIG. 4 is a top-down diagram of a PCB installed in an enclosure in accordance with the present principles.

Referring now to FIG. 4, a top-down diagram of a PCB 202 installed in an enclosure 102 is shown.

Figure 5:
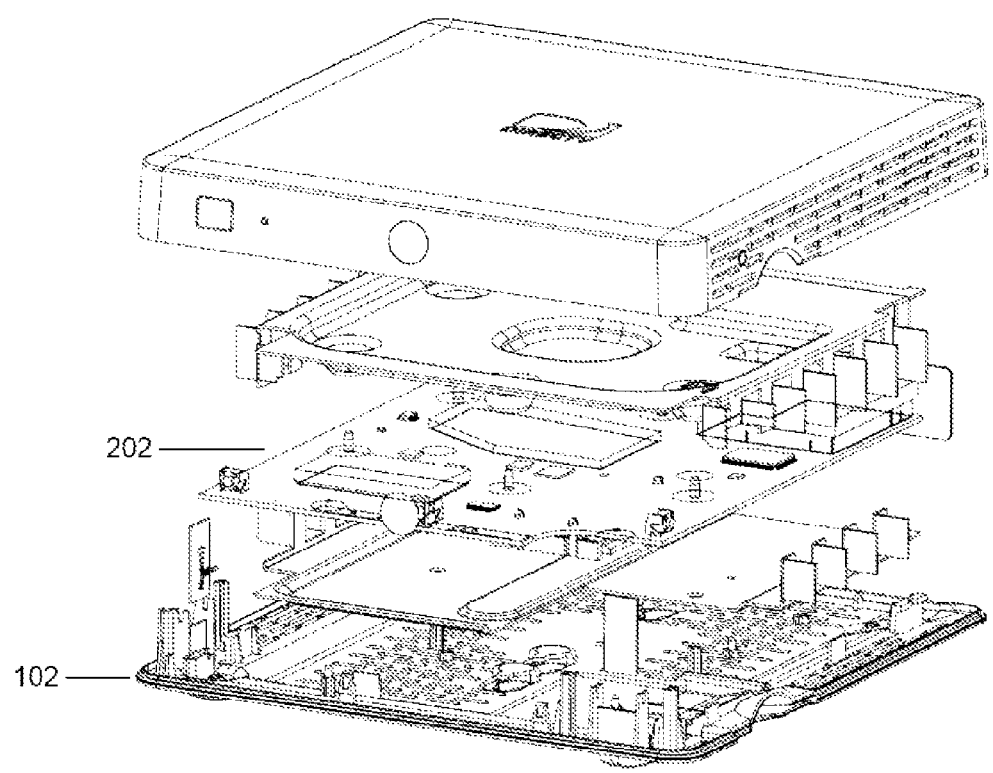
FIG. 5 is an magnified diagram of an embodiment of the present principles, showing a PCB in relation to an enclosure.

Referring now to FIG. 5, a magnified diagram of an embodiment of the present principles is shown, showing a PCB 202 in relation to an enclosure 102.

Figure 6:
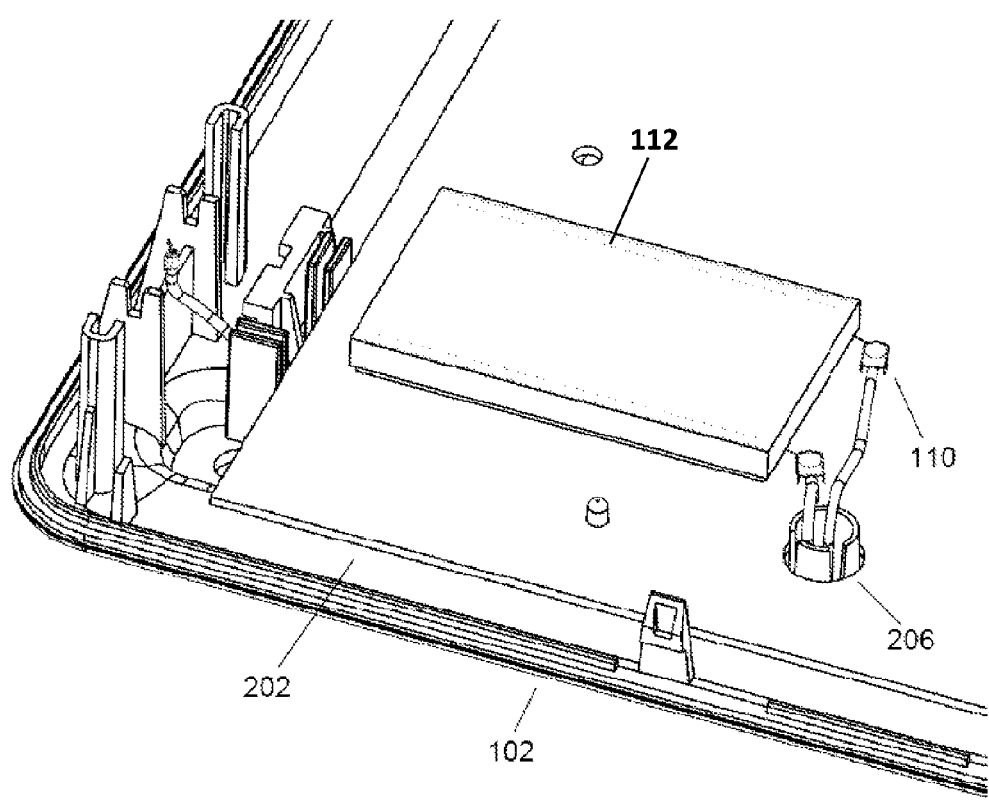
FIG. 6 is a perspective diagram of a PCB installed in an enclosure in accordance with the present principles.

Referring now to FIG. 6, a perspective diagram of a PCB 202 installed in an enclosure 102 is shown. The PCB has a hole 206 from which emerge leads 110.

Figure 7:
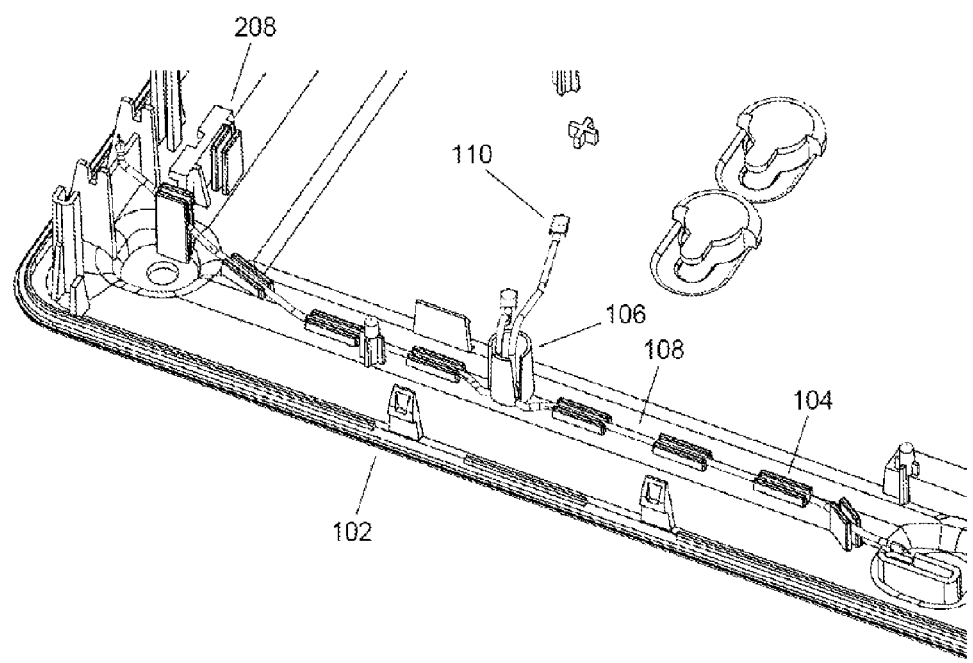
FIG. 7 is a diagram of cable guides and a cable duct in an enclosure in accordance with the present principles.

Referring now to FIG. 7, the diagram of FIG. 1 is shown from a greater distance, illustrating the relationship between the cables 108, the cable guides 104, and the antenna enclosure 208.

Figure 8:
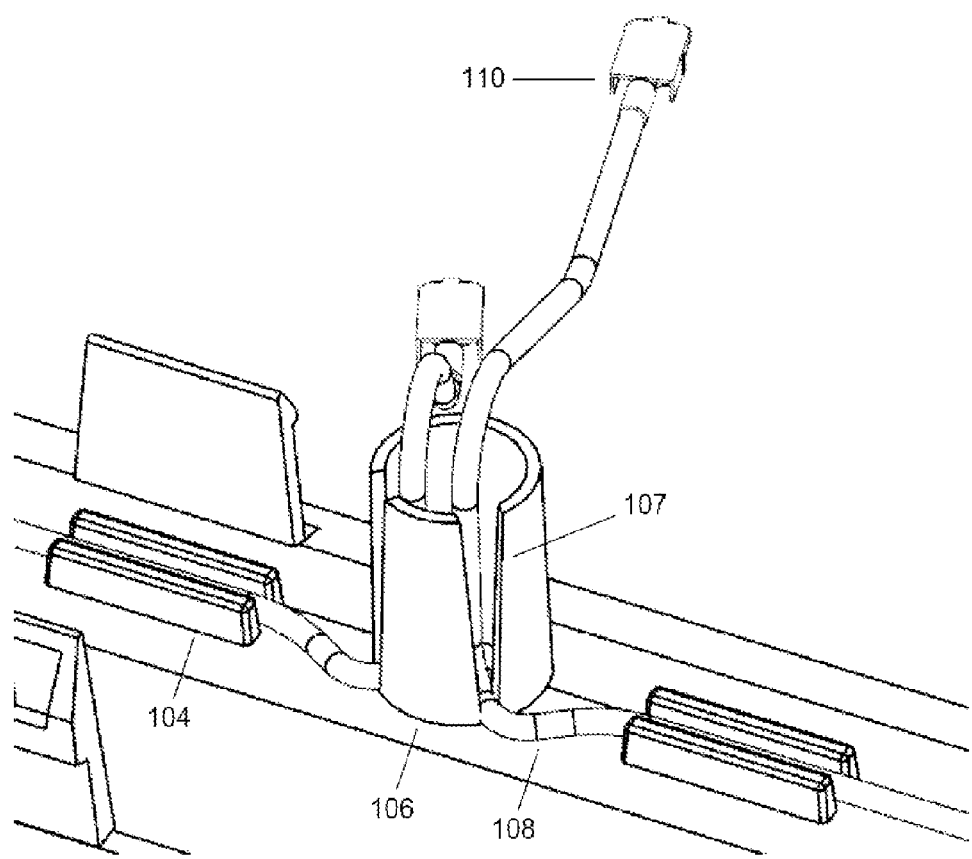
FIG. 8 is a diagram of cable guides and a cable duct in an enclosure in accordance with the present principles.

Referring now to FIG. 8, the diagram of FIG. 1 is shown in greater detail. The cables 108 are shown being held in the notches 107 of the cable duct 106 with friction or through compression.

Figure 9:
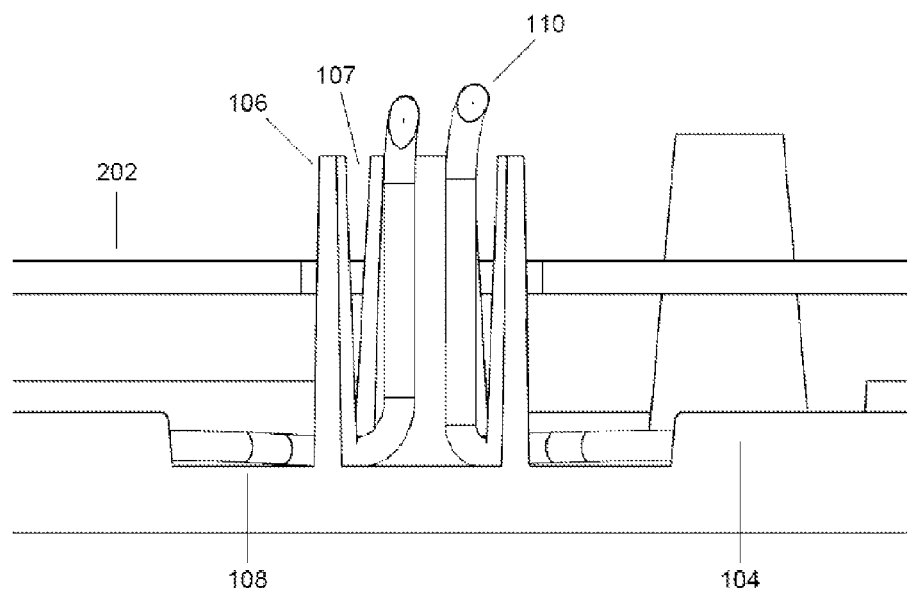
FIG. 9 is a cross-section view of a cable duct in an enclosure having an installed PCB in accordance with the present principles.

Referring now to FIG. 9, a cross-section view of the cable duct 106 is shown, with cables 108 entering at the bottom through notches 107 and emerging from the top, above a PCB 202.

Figure 10:
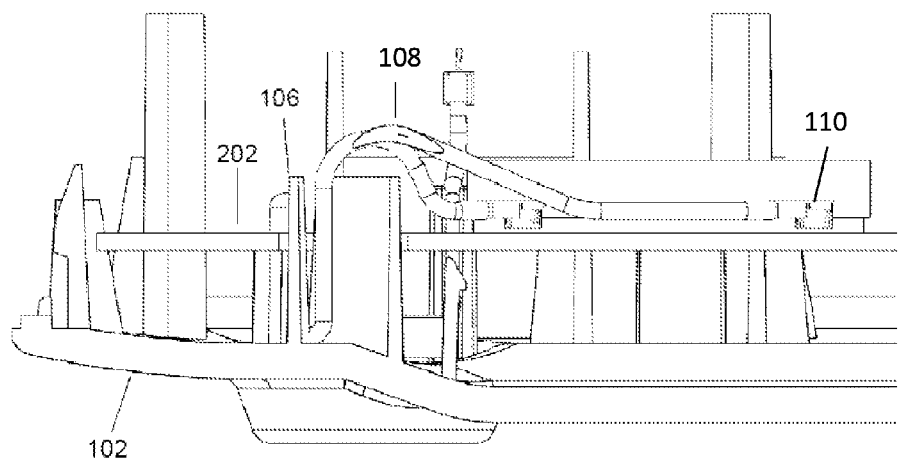
FIG. 10 is a cross-section view of a cable duct in an enclosure having an installed PCB in accordance with the present principles.

Referring now to FIG. 10, a cross-section view of the cable duct 106 is shown. The cable leads 110 emerge from the cable duct 106 and are connected to attachment points on a PCB 202.

Figure 11:
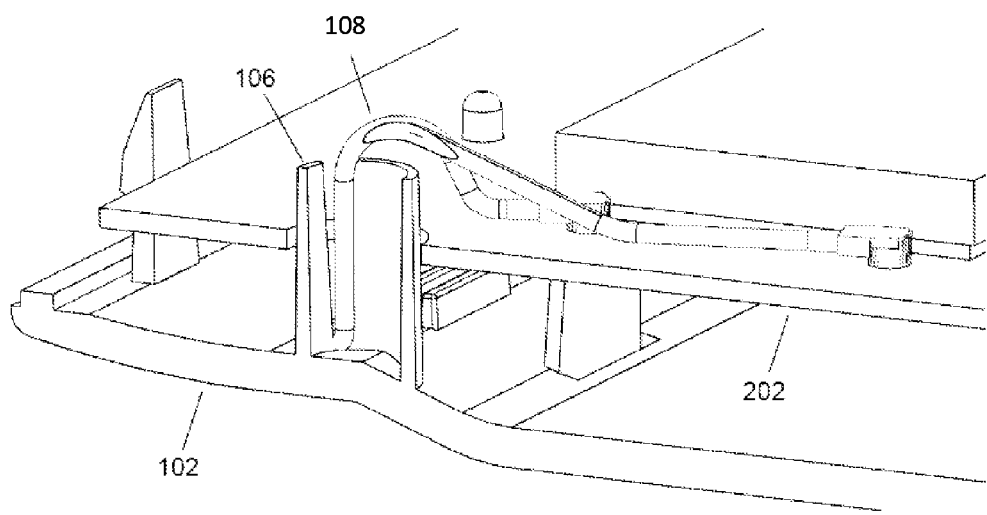
FIG. 11 is a perspective view of a cable duct in an enclosure having an installed PCB in accordance with the present principles.

Referring now to FIG. 11, a perspective view of FIG. 10 is shown.

Figure 12:
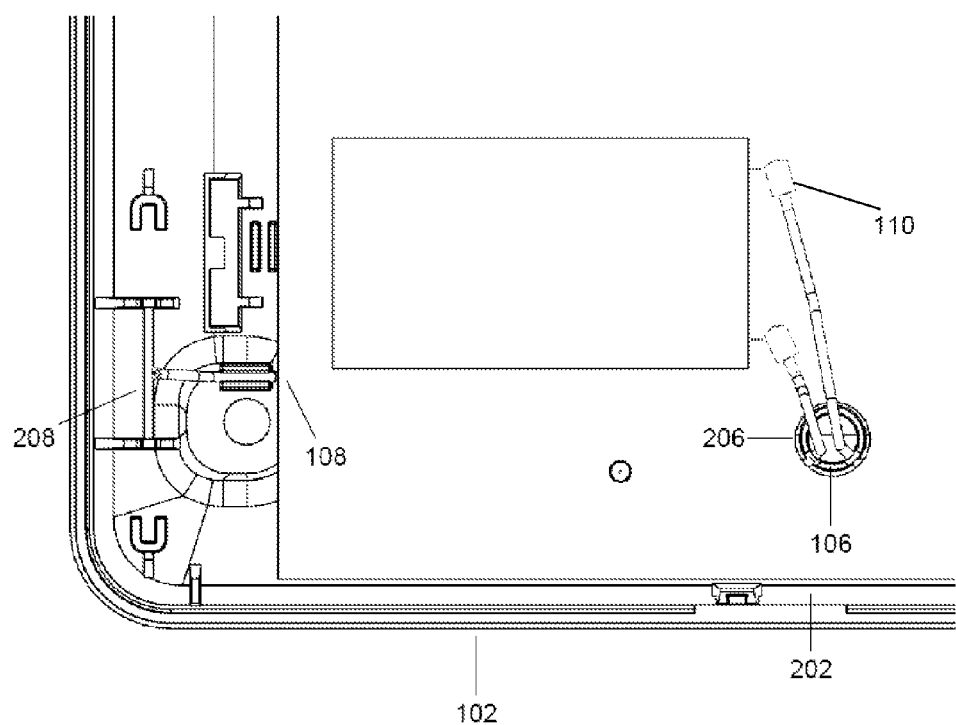
FIG. 12 is a top-down view of a PCB installed in an enclosure in accordance with the present principles.

Referring now to FIG. 12, a top-down view of a PCB 202 is shown. The PCB 202 is mounted in an enclosure 102, with a cable duct 106 emerging from hole 206. The cable 108 is shown at its attachment to an antenna enclosure 208 before it emerges from the hole 206 to be connected by its cable lead 110 to the PCB 202.

Figure 13:
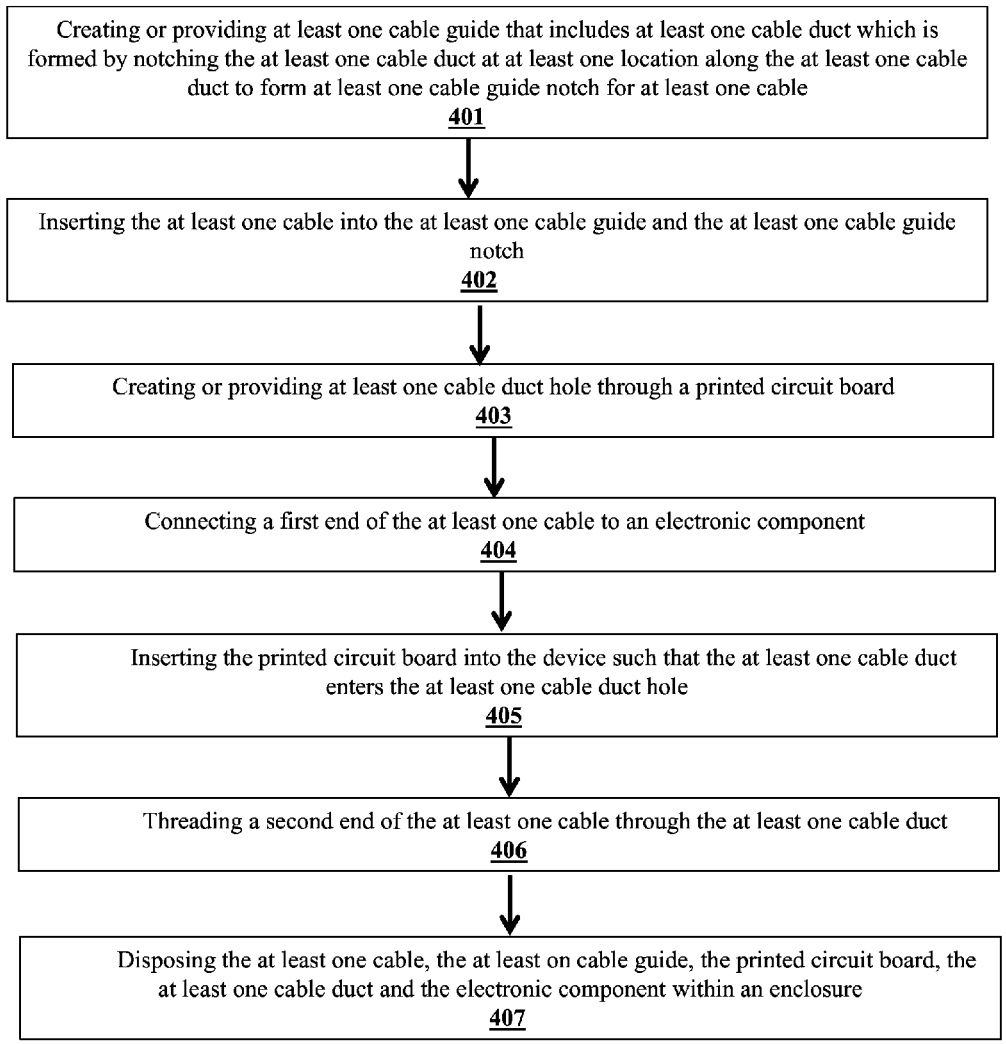
FIG. 13 is another block/flow diagram of a method for assembling an enclosure having cable guides and a cable duct in accordance with the present principles.

Referring now to FIG. 13, a method of assembling a device is shown. 12. Block 401 creates or provides at least one cable guide 104 that includes at least one cable duct 106 which is formed by notching the at least one cable duct at least one location along the at least one cable duct to form at least one cable guide notch 107 for at least one cable 108. The feature of providing is intended to include accessing an enclosure having cable guides. Also, in this embodiment, one can consider the cable ducts as being a cable guide or part of the cable guide.

Block 402 inserts the at least one cable into the at least one cable guide and the at least one cable guide notch. This inserting step can involve folding or coiling part of the cable with the cable lead within an interior space of the at least one cable duct.

Block 403 creates or provides at least one cable duct hole 206 through a printed circuit board 202. The feature of providing is intended to include accessing a printed circuit board having the corresponding cable duct holes 206.

Block 404 connects a first end of the at least one cable to an electronic component such as an antenna 208. The electronic component can be positioned to not be on the printed circuit board.

Block 405 inserts the printed circuit board into the device such that the at least one cable duct enters the at least one cable duct hole.

Block 406 threads a second end 110 of the at least one cable through the at least one cable duct.

Block 407 disposes the at least one cable, the at least on cable guide, the printed circuit board, the at least one cable duct and the electronic component within an enclosure 102. The enclosure can be ventilated. Also, prior to closing the enclosure, a second end of the at least one cable can be connected to a second electronic component 112 on or over the printed circuit board. The device can have a plurality of further electronic components populated on the printed circuit board to enable the device to operate as a set top box when it is electrically powered.

It should be noted that although the steps in FIG. 3 and FIG. 13 have been outlined in a certain order, the execution of these steps in a different order is within the scope of the disclosed principles.

Having described preferred embodiments for systems and methods for color correction between displays with and without average picture dependency and permitting predictable creative differences therebetween (which are intended to be illustrative and not limiting), it is noted that modifications and variations can be made by persons skilled in the art in light of the above teachings. It is therefore to be understood that changes may be made in the particular embodiments of the invention disclosed which are within the scope of the invention as outlined by the appended claims. While the forgoing is directed to various embodiments of the present invention, other and further embodiments of the invention may be devised without departing from the basic scope thereof.

The invention claimed is:

1. A device, comprising:
   an enclosure comprising at least one cable guide and a cable duct;
   a printed circuit board (PCB) mounted in the enclosure, such that the cable duct penetrates the PCB through a hole in the PCB;
   at least one additional component mounted in the enclosure; and
   at least one cable that is connected to the at least one additional component and is attached to the at least one cable guide and the cable duct, wherein the cable duct comprises one or more notches that provide access to a duct interior space for the at least one cable, wherein said at least one cable enters the cable duct on a first side of the PCB and exits the cable duct on a second side of the PCB.

2. The device of claim 1, wherein the notches have a tapering width that tapers to a width smaller than a width of the at least one cable.

3. The device of claim 1, wherein the at least one cable is held in the one or more notches by friction.

4. The device of claim 1, the at least one additional component comprises an antenna.

5. The device of claim 1, wherein the cable is attached to the cable guides using one of glue and hook-and-loop fasters.

6. The device of claim 1, wherein the at least one cable is attached to at least one second component on or over the second side of the PCB.

7. A set top box, comprising:
   an enclosure comprising at least one cable guide and a cable duct, wherein the cable duct comprises one or more notches that provide access to a duct interior space;
   a printed circuit board (PCB) mounted in the enclosure, such that the cable duct penetrates the PCB through a hole in the PCB;
   an antenna mounted in the enclosure; and
   at least one cable that is connected to the antenna and is attached to the at least one cable guide and runs into the duct interior space, wherein said at least one cable enters the cable duct on a first side of the PCB and exits the cable duct on a second side of the PCB, and wherein the at least one cable is held in the one or more notches by friction.

8. The set top box of claim 7, wherein the notches have a tapering width that tapers to a width smaller than a width of the at least one cable.

9. The set top box of claim 7, wherein the cable is attached to the cable guides using one of glue and hook-and-loop fasters.

10. The set top box of claim 7, wherein the at least one cable is attached to at least one second component on or over the second side of the PCB.

11. A method for assembling a device, comprising:
    accessing an enclosure having at least one cable guide and at least one cable duct having at least one cable guide notch for at least one cable, the cable guide notch formed by notching the at least one cable duct at one or more locations along the at least one cable duct;
    inserting the at least one cable into the at least one cable guide and the at least one cable guide notch;
    providing at least one cable duct hole through a printed circuit board;
    connecting a first end of the at least one cable to an electronic component;
    inserting the printed circuit board into the device such that the at least one cable duct enters the at least one cable duct hole;
    threading a second end of the at least one cable through the at least one cable duct; and
    disposing the at least one cable, the at least on cable guide, the printed circuit board, the at least one cable duct and the electronic component within an enclosure.

12. The method of claim 11, wherein the enclosure is ventilated.

13. The method of claim 11, comprising the step of connecting the second end of the at least one cable to a second electronic component on or over the printed circuit board.

14. The method of claim 11, comprising the step of populating said printed circuit board with a plurality of further electronic components enabling said device to operate as a set top box.

15. The method of claim 14, comprising the step of enabling said set top box to be electrically powered.

16. The method of claim 11, wherein the electronic component comprises an antenna.

17. The method of claim 11, wherein inserting the at least one cable into the at least one cable guide notch comprises folding or coiling part of the at least one cable with the at least one cable lead within an interior space of the at least one cable duct.

18. The method of claim 17, further comprising connecting the second end of the at least one cable to a second electronic component on or over the printed circuit board, wherein the electronic component is not on the printed circuit board.

* * * * *